(12) United States Patent
Hsu

(10) Patent No.: US 7,268,922 B2
(45) Date of Patent: Sep. 11, 2007

(54) CHASSIS LOCKING APPARATUS CAPABLE OF BEING UNLOCKED SPONTANEOUSLY

(75) Inventor: Hsiu-O Hsu, Taipei (TW)

(73) Assignee: Transpacific IP, Ltd., Taipei (TW)

( * ) Notice: Subject to any disclaimer, the term of this patent is extended or adjusted under 35 U.S.C. 154(b) by 849 days.

(21) Appl. No.: 10/330,144

(22) Filed: Dec. 30, 2002

(65) Prior Publication Data
US 2004/0022033 A1 Feb. 5, 2004

(30) Foreign Application Priority Data
Jul. 31, 2002 (TW) ............................ 91211772 U

(51) Int. Cl.
*H04N 1/04* (2006.01)
*H04N 1/40* (2006.01)

(52) U.S. Cl. ...................... 358/474; 358/471; 358/482; 358/483

(58) Field of Classification Search ................ 358/474, 358/471, 482, 483, 497; 399/211, 212
See application file for complete search history.

(56) References Cited

U.S. PATENT DOCUMENTS 5,973,866 A * 10/1999 Tseng .......................... 359/896
6,476,373 B1 * 11/2002 Gilpin ....................... 250/208.1
6,700,717 B2 * 3/2004 Lee ............................. 359/896
6,937,368 B2 * 8/2005 Liu ............................. 358/474
7,068,401 B2 * 6/2006 Johnson et al. ............. 358/474

* cited by examiner

*Primary Examiner*—Jerome Grant
*Assistant Examiner*—Houshang Safaipour
(74) *Attorney, Agent, or Firm*—Marger Johnson & McCollom P.C.

(57) ABSTRACT

A chassis locking apparatus capable of being unlocked spontaneously is used for fixing the chassis in a scanner. The locking apparatus includes a groove interlinking next to the electric socket, a push rod in the groove, and a revolving locking element. By means of the strength of inserting the plug into the socket on the scanner, the push rod is pushed to move along the groove and hit the locking element, which is originally fixed on the chassis, to make the locking element rotate so that the chassis locking apparatus can be unlocked spontaneously. Therefore, no effort is necessary for a user to unlock the chassis locking apparatus by hand before using the scanner, which is convenient and timesaving.

18 Claims, 1 Drawing Sheet

CHASSIS LOCKING APPARATUS CAPABLE OF BEING UNLOCKED SPONTANEOUSLY

This application incorporates by reference Taiwan application Serial No. 091211772, Filed Jul. 31, 2002.

BACKGROUND OF THE INVENTION

1. Field of the Invention

The invention relates in general to a chassis locking apparatus in a scanner, and more particularly to a chassis locking apparatus, which can be unlocked spontaneously as the scanner is actuated by inserting the plug into the socket.

2. Description of the Related Art

A scanner is an image-capturing device, which can transform the images originally distinguishable by human brains into digital data readable by electric brains or computers. Images read by computers can be displayed, edited, stored, and output. Scanners help human beings to complete many jobs such as puffing art graphs and pictures into documents, scanning characters into a document processing software to save time for re-typewriting, scanning fax information into a database or a document processing software for storage, putting lively pictures into multi-media, integrating images into a brief to express subjects more effectively, and so on. Because of the various advantages as mentioned above, scanners become indispensable periphery equipments for PC users or companies.

In general, the flatbed scanner has a chassis for sensing images. The chassis includes a photoelectric sensing device and a light source. The light sent out from the light source is reflected by the document on the glass flatbed and received by the photoelectric sensing device where the received light signals are transformed to electric signals. These devices in the chassis are all delicate components related to the quality of the scanning images. Any shock or crash in transit will easily damage these components in the chassis and then reduce the quality of the scanning images. Therefore, when the scanner is fabricated, a locking apparatus is usually installed for fixing the chassis in the scanner so that any shock or crash in transit will not damage these delicate components.

However, the conventional chassis locking apparatus is an independent apparatus without any concern with the components or devices operating in the scanner. It means that the user has to unlock the chassis locking apparatus by hand whenever the scanner is to be actuated, which results in inconvenience. Therefore, how to develop a chassis locking apparatus easy to unlock by users or even with no need to unlock by hand becomes a subject to be improved for producers.

SUMMARY OF THE INVENTION

It is therefore an object of the invention to provide a chassis locking apparatus capable of being unlocked spontaneously. By means of the strength for inserting the plug into the socket on the scanner, the chassis locking apparatus can be unlocked spontaneously. Therefore, no effort is necessary for a user to unlock the chassis locking apparatus by hand before using the scanner, which is convenient and timesaving.

According to the object of the invention, a chassis locking apparatus capable of being locked spontaneously is provided. The locking apparatus includes a groove interlinking next to the electric socket, a push rod installed in the groove, and a revolving locking element, an axis of which is fixed. The locking element includes a locking part for fixing the chassis in the scanner. When the plug is inserted into the electric socket, the plug pushes the push rod to hit the locking element and make it rotate about its axis. As a result, the locking part departs from the locking position and the chassis locking apparatus is then unlocked spontaneously.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

The chassis locking apparatus capable of being unlocked spontaneously in the invention is unlocked spontaneously by inserting the plug into the electric socket to push a push rod installed in the electric socket to hit the locking element which locks the chassis originally and thus the locking apparatus is unlocked spontaneously.

Figure 1:
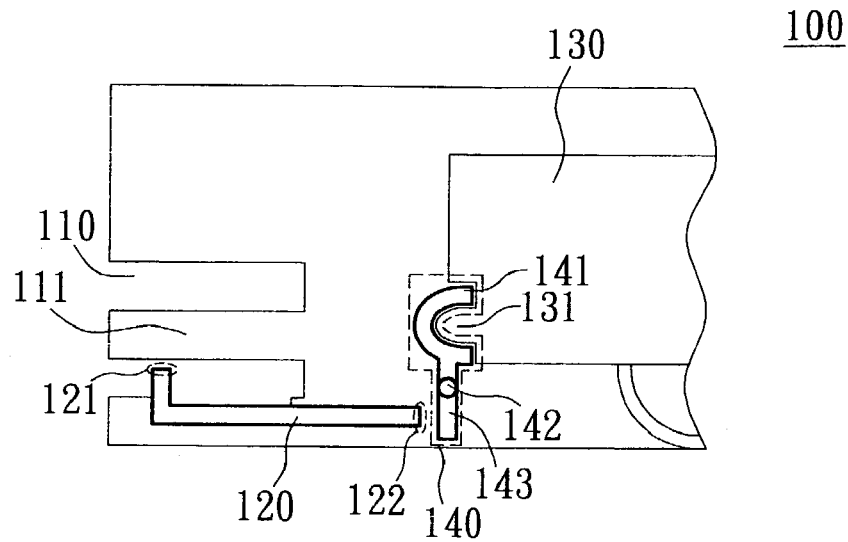
FIG. 1 is a partial sectional drawing of the locking apparatus according to the preferred embodiment of the invention.
Figure 2:
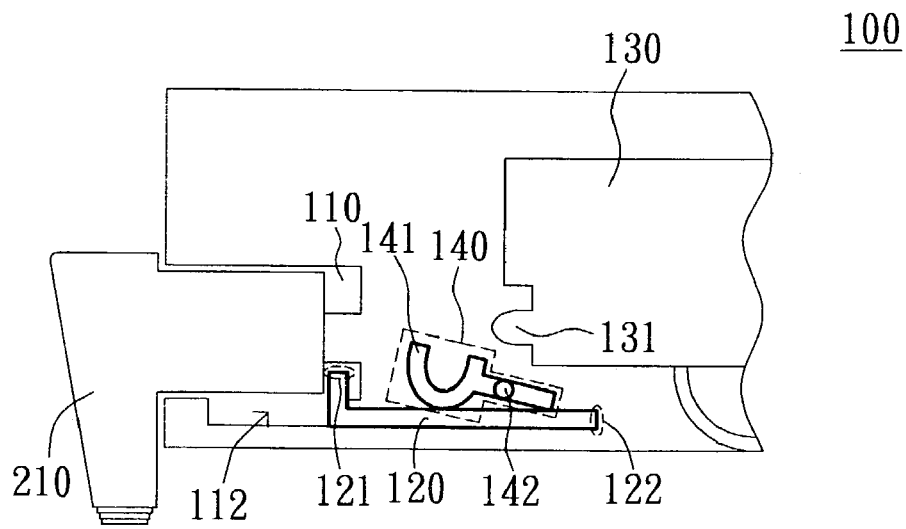
FIG. 2 is a partial sectional diagram of the locking apparatus after being unlocked according to the preferred embodiment of the invention.

Referring to FIG. 1, a partial sectional drawing of the locking apparatus according to the preferred embodiment of the invention is shown. On the sidewall of the scanner 100, there is an electric socket 110, under the electric pin 111 of which is a groove 112 (as shown in FIG. 2). The groove 112 interlinks to the electric socket 110 and a push rod 120 is installed in the groove 112. A push part 121 of the push rod 120 projects from the groove 112 without touching the electric pin 111. Moreover, the push rod 120 is positioned at the outer terminal of the groove 112 as the scanner 100 is produced.

The scanner 100 includes a chassis 130. After the scanner 100 is produced, a fixing part 131 shaped into a circular convex on the chassis 130 is hooked up by a locking element 140 so that the chassis 130 is locked and fixed at one side of the scanner 100 to protect all the delicate components in the chassis 130 from being damaged as the chassis 130 is shocked or slid in transit.

The locking element 140 includes a locking part 141 which is a C-shaped hook for hooking the fixing part 131, a bearing part 143 positioned corresponding to the hitting part 122 of the push rod 120, and an axis in the center for fixing the locking element 140 in the scanner 100.

Referring to FIG. 2, a partial sectional diagram of the locking apparatus after being unlocked according to the preferred embodiment of the invention is shown. When the scanner 100 is used for the first time, the plug 210 has to be inserted into the electric socket 110 so that the scanner can be switched on. For the push part 121 projects from the groove 112, the plug 210 will prop the push part 121 and push the push rod 120 after the plug 210 is inserted into the electric socket 110. The push rod 120 is pushed to move forward along the groove 112 and the hitting part 122 of the push rod 120 hits the bearing part 143 of the locking element 140, and consequently the locking part 141 departs from the chassis 130.

Figure 3:
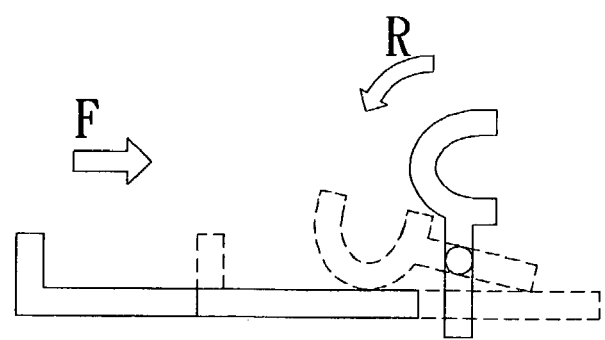
FIG. 3 is a diagram of the locking apparatus with the push rod hitting the locking element.

Referring to FIG. 3, a diagram of the locking apparatus with the push rod hitting the locking element is shown. Referring to FIG. 1 and FIG. 2 along with FIG. 3, the arrow F and the arrow R are respectively referred to the moving directions of the push rod 120 and the locking part 141. The solid lines shows the positions of the push rod 120 and the locking part 141 before being shifted while the dotted lines shows the positions of the push 120 and the locking part 141 after being shifted. For the locking element 140 is fixed on the wall of the scanner 100 by the axis 142, the locking element 140 will rotate around the axis 142 counterclockwise after the bearing part 143 is hit. The locking part 141 thus departs from the fixing part 131 and the progress of being unlocked spontaneously is completed. The push rod 120 and the locking element 140 are made of rigid materials, which are endurable for the hitting strength in the unlocking progress.

In addition, in the preferred embodiment of the invention, the locking part 141 is placed above the bearing part 143 so that when the bearing part 143 is hit at the left side, the locking part 141 will rotate counterclockwise. In the real practice, the locking part 141 can also be placed under the bearing part 143. Since the bearing part 143 is positioned corresponding to the hitting part 122 of the push rod 120, the locking element 140 will rotate clockwise and depart from the fixing part 131 as the bearing part 143 is hit at the left side by the hitting part 122, which can also achieve the purpose of being unlocked spontaneously.

Moreover, the shapes and positions of the groove 112 and the push rod 120 are not limited. Although the groove is positioned under the electric socket and the push rod 120 is L-shaped in the preferred embodiment of the invention, in the real practice, the groove can be positioned above the electric socket and correspondingly, the push rod 120 is inverted L-shaped or the push rod 120 can be a straight stick or any other shape as long as the push rod 120 includes a push part 121 for being pushed by the plug 210 and a hitting part 122 for hitting the bearing part 143, which still conforms to the spirit of the invention.

Furthermore, in the preferred embodiment, the locking part 141 and the fixing part 131 are respectively a C-shaped hook and a circular convex so that the locking part grips the corresponding fixing part. The locking part 141 can be shaped into a spherical convex where the fixing part 131 be shaped into a spherical concave so that the locking part is embedded into the corresponding fixing part. Any other shapes of the locking part 141 and the corresponding fixing part 131 can mate with each other for securing are still in the scope of the invention.

In the preferred embodiment described herein, the advantage of the chassis locking apparatus capable of being unlocked spontaneously according to the invention is capable of being unlocked spontaneously by the strength of inserting the plug into the electric socket as the scanner is actuated. In this way, no effort is necessary for a user to unlock the chassis locking apparatus by hand before using the scanner, which is convenient and timesaving.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A chassis-locking apparatus, comprising:
   a rod part, a push part and a hitting part;
   a socket capable of receiving a plug, the socket comprising a groove having at least a closed end and an open end, and capable of receiving the push rod so that at least a portion of the hitting part of the push rod projects from the open end of the groove; and
   a locking element comprising an axis, a locking part at a first end, and a bearing part at a second end, the axis capable of coupling the locking element, the locking part capable of rotating about the axis, and the locking part capable of securing a corresponding fixing part of a chassis of the scanner, a position of the bearing part corresponding to a position of the hitting part of the push rod; and
   wherein if a plug is inserted into the socket, the plug is capable of pushing the push part of the push rod and extending the push rod along the groove;
   wherein the hitting part of the push rod is capable of pushing the bearing part of the locking element to make the locking element rotate about the axis so that the locking part separates from the fixing part of the chassis; and
   wherein the closed end is capable of contacting the push rod if the push rod is extended a full length of the groove toward the closed end.

2. The locking apparatus according to claim 1, wherein the groove is positioned under the socket.

3. The locking apparatus according to claim 2, wherein the push rod is substantially L-shaped.

4. The locking apparatus according to claim 1, wherein the groove is positioned above the socket.

5. The locking apparatus according to claim 4, wherein the push rod is substantially inverted L-shaped.

6. The locking apparatus according to claim 1, wherein the push rod is a substantially straight.

7. The locking apparatus according to claim 1, wherein the push rod is positioned at an outer terminal of the groove.

8. The locking apparatus according to claim 1, wherein the bearing part of the locking element is under the locking part and the locking element is capable of rotating if the bearing part is hit.

9. The locking apparatus according to claim 1, wherein the bearing part of the locking element is above the locking part and the locking element is capable of rotating if the bearing part is hit.

10. The locking apparatus according to claim 1, wherein the bearing part of the locking element at least intersects a path of the push rod.

11. The locking apparatus according to claim 1, wherein the locking part of the locking element is substantially a C-shaped hook and the fixing part of the chassis is substantially a circular convex so that the locking part is capable of gripping the corresponding fixing part.

12. The locking apparatus according to claim 1, wherein the locking part of the locking element is substantially a spherical convex and the fixing part of the chassis is substantially a spherical concave so that the locking part is capable of coupling to the corresponding fixing part.

13. The locking apparatus according to claim 1, wherein the axis is capable of fixing the locking element on a sidewall of the chassis.

14. The locking apparatus according to claim 1, wherein the push rod and the locking element are made of substantially rigid materials.

15. The locking apparatus according to claim 1, wherein the open end comprises an aperture on an inside surface of the socket.

16. The locking apparatus according to claim 1, wherein the push rod is substantially the same length as a length of the groove.

17. The locking apparatus according to claim 1, wherein the socket is an electrical socket.

18. An apparatus comprising: means for securing a chassis to a scanner through a socket such that it may be unsecured spontaneously; and means for preventing an element of the electric socket from coming into contact with an element of a locking mechanism, the element of a locking mechanism including a push rod;

means for mating a fixing part to a locking part;

means for receiving a plug into a socket, the socket comprising a groove, the groove comprising a closed end and an open end;

means for receiving the push rod in the groove so that at least a portion of a hitting part of the push rod projects from the open end of the groove;

wherein the locking mechanism comprises:

means for disposing a locking part at a first end of the locking element comprising an axis;

means for disposing a bearing part at a second end of the locking element, a position of the bearing part corresponding to a position of the hitting part of the push rod;

means for coupling the locking element in the scanner via the axis;

means for rotating the locking part and the bearing part about the axis;

means for securing a corresponding fixing part of the chassis of the scanner via the locking part; and wherein the means for receiving the plug into the socket further comprises:

means for pushing the push part of the push rod in response to receiving the plug; and means for moving the push rod along the groove so that the hitting part of the push rod pushes the bearing part of the locking element to make the locking element rotate about the axis so that the locking part separates from the fixing part of the chassis.

* * * * *